United States Patent
Chen et al.

(10) Patent No.: US 6,787,408 B2
(45) Date of Patent: Sep. 7, 2004

(54) METHOD FOR FORMING AN ELECTRICAL INSULATING LAYER ON BIT LINES OF THE FLASH MEMORY

(75) Inventors: Chien-Wei Chen, Hsinchu (TW); Jiun-Ren Lai, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 185 days.

(21) Appl. No.: 09/930,856

(22) Filed: Aug. 16, 2001

(65) Prior Publication Data

US 2002/0175139 A1 Nov. 28, 2002

(30) Foreign Application Priority Data

May 22, 2001 (TW) .......................... 90112306 A

(51) Int. Cl.[7] ............................................ H01L 21/338
(52) U.S. Cl. ...................... 438/183; 438/197; 438/152; 438/723
(58) Field of Search ................................ 438/183, 197, 438/152, 257–267, 697, 706, 710–714, 722, 723; 257/314–316

(56) References Cited

U.S. PATENT DOCUMENTS 5,637,896 A * 6/1997 Huang ........................ 257/316
5,814,564 A * 9/1998 Yao et al. .................... 438/723
5,968,610 A * 10/1999 Liu et al. ..................... 427/579
6,080,639 A * 6/2000 Huang et al. ................ 438/435
6,492,214 B2 * 12/2002 Chen et al. .................. 438/183

\* cited by examiner

*Primary Examiner*—Nadine G. Norton
*Assistant Examiner*—Duy-Vu Deo
(74) *Attorney, Agent, or Firm*—Dickinson Wright PLLC

(57) ABSTRACT

A method for forming an electrical insulating layer on bit lines of the flash memory is disclosed. A conductive layer, a mask layer and a cap layer are sequentially formed on a semiconductor substrate and then are etched to form a plurality of spacing. Afterwards, a dielectric layer is formed on the semiconductor substrate and a planarized layer is then formed on the dielectric layer. The planarized layer and the dielectric layer are etched sequentially wherein the etching rate of the planarized layer is less than that of the dielectric layer. Next, the dielectric layer is etched to remove a portion of the dielectric layer wherein the etching rate of the dielectric layer is higher than that of the cap layer, and thus a spacing dielectric layer is formed on the spacing. Thereafter, the cap layer is stripped wherein the etching rate of the dielectric layer is less than that of the mask layer so that the spacing dielectric layer has a round top and slant sides. Finally, the mask layer is stripped and then the spacing dielectric layer remains to form the electrical insulating layer on bit lines of the flash memory.

20 Claims, 3 Drawing Sheets

METHOD FOR FORMING AN ELECTRICAL INSULATING LAYER ON BIT LINES OF THE FLASH MEMORY

FIELD OF THE INVENTION

The present invention generally relates to a method for forming an electrical insulating layer during the semiconductor processes, and more particularly, to a method for forming an electrical insulating layer on bit lines of the flash memory.

BACKGROUND OF THE INVENTION

Since the main purpose of the flash memory's cell is to retain electrons for recording the desired information, it is considerably important to be able to maintain a long span of charge retention. Generally, the electrons will be lost due to the failure of the electrical insulating layer over the flash memory's cell. Especially, it is the key point of charge retention whether the electrical insulating layer has a good insulating characteristic with respect to silicon-oxide layer on the bit lines. The conventional method for fabricating an electrical insulating layer on the flash memory's cell is shown in FIGS. 1–3.

Referring to FIG. 1, a polysilicon layer 102, a silicon nitride layer 104 and a cap layer 106 are sequentially formed on a gate region of a semiconductor substrate 100. Thereafter, a lithography and etching process is used to form spacing 110 between gate stacks 108. The silicon-oxide is filled into the spacing 110 by using a chemical vapor deposition (CVD) process. Since the structure of the silicon-oxide layer 112 formed by CVD process is undulated with the spacing 110, the top surface of the silicon-oxide layer 112 between the spacing 110 has a recess 114a.

Referring to FIG. 2, an etch back or chemical mechanical polishing (CMP) process is carried out to remove the silicon-oxide layer's 112 recess 114a. The silicon nitride layer 104 serves as a stop layer so that the silicon-oxide is left inside spacing 110 to form a spacing silicon-oxide layer 116. According to the foregoing, since the top surface of silicon-oxide layer 112 is undulated with spacing 110, the so-called conformity, the surface of the spacing silicon-oxide layer 116 must still keep a recessed profile after an etch back. If the CMP process is used to remove the redundant silicon-oxide, the spacing silicon-oxide layer 116 also forms a recess 114b due to dish effect. Finally, referring FIG. 3, while a silicon nitride layer 104 is removed, the recess 114b is generated on the surface of the spacing silicon-oxide layer 116.

However, the recess 114b on the surface of the spacing silicon-oxide layer 116 has many disadvantages. The effective thickness 118 of the spacing silicon-oxide layer 114 is not enough to block a great deal of the impact of electrons but to severely destroy the bit lines (not shown in the figure) located under the spacing silicon-oxide layer 116. Additionally, the tip 120 portion of the spacing silicon-oxide layer 116 will cause the film to crack when a deposition process is performed continuously. Further, after the silicon nitride layer 104 is removed, the step height between the polysilicon layer 102 and the spacing silicon-oxide layer 116 is too high so that the over-etching must be greatly increased but etching tolerance is inadequate resulting in the thin film's damage.

SUMMARY OF THE INVENTION

In view of the problems encountered with the foregoing conventional electrical insulating layer including the spacing silicon-oxide layer in the flash memory, the effective thickness of the spacing silicon-oxide layer is not sufficient and its profile is inferior to the one of the present invention.

As a result, the primary object of the present invention is to form a dielectric layer and a planarized layer, and adjusts the etching rate ratio between the dielectric layer and the planarized layer for generating the spacing dielectric layer, such as silicon-oxide, having a round top and slant sides to benefit the following processes.

Another object of the present invention is to increase the effective thickness of the spacing of the silicon-oxide layer for blocking the bit lines from an ion implantation process.

According to the above objects, the present invention sets forth a method for forming an electrical insulating layer on bit lines of the flash memory. First, a plurality of gate stacks are sequentially formed on the gate region of a semiconductor substrate wherein each of the gate stacks has a conductive layer, a mask layer and a cap layer, and the gate stacks are etched to form a plurality of spacing. Afterwards, a dielectric layer is formed on the semiconductor substrate to cover the gate stacks and then to fill the spacing, and the dielectric layer is higher than the cap layer. A planarized layer is then formed on the dielectric layer to create a planar surface.

One etching step is utilized to entirely remove the dielectric layer located on the cap layer and thus spacing dielectric layer is formed inside the spacing. Afterwards, another etching step is used to remove the cap layer wherein the etching rate of the dielectric layer is less than that of the mask layer so that the spacing dielectric layer has a round top and slant sides to prevent a thin film of the following process from stress concentration. Finally, the mask layer is stripped and then the spacing silicon-oxide layer remains to form the electrical insulating layer on bit lines of the flash memory.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention is directed to a method for forming an electrical insulating layer on bit lines of the flash memory to improve the shortcomings of the prior art.

Figure 1:
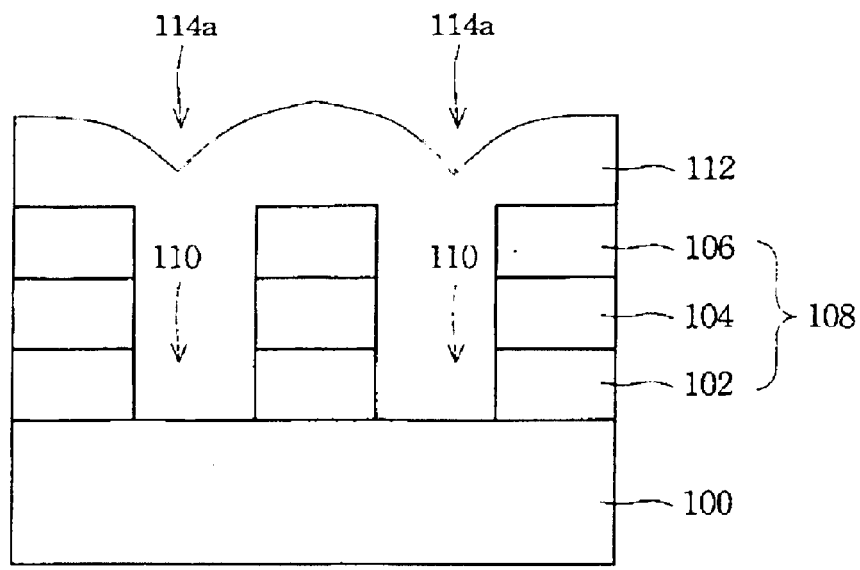
FIGS. 1–3 illustrate cross-sectional views of a conventional process for fabricating an electrical insulating layer.
Figure 2:
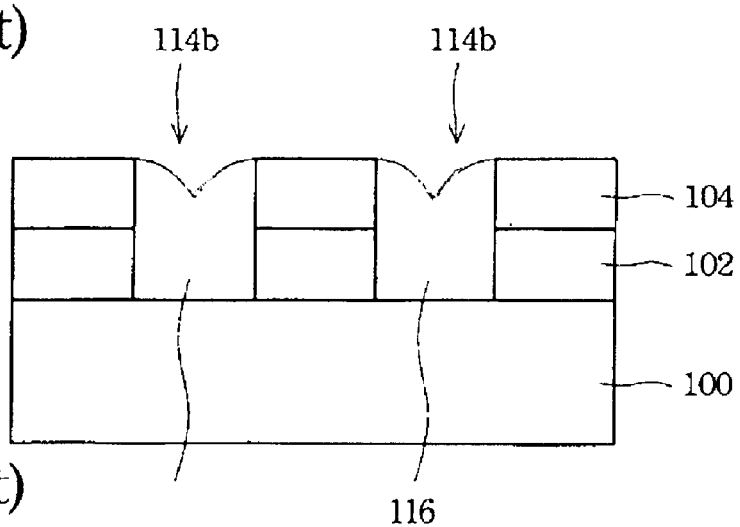
Figure 3:
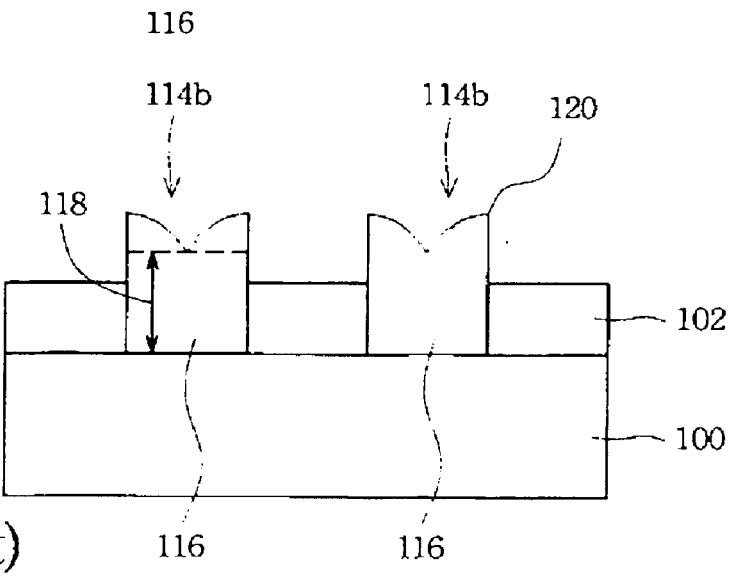
Figure 4:
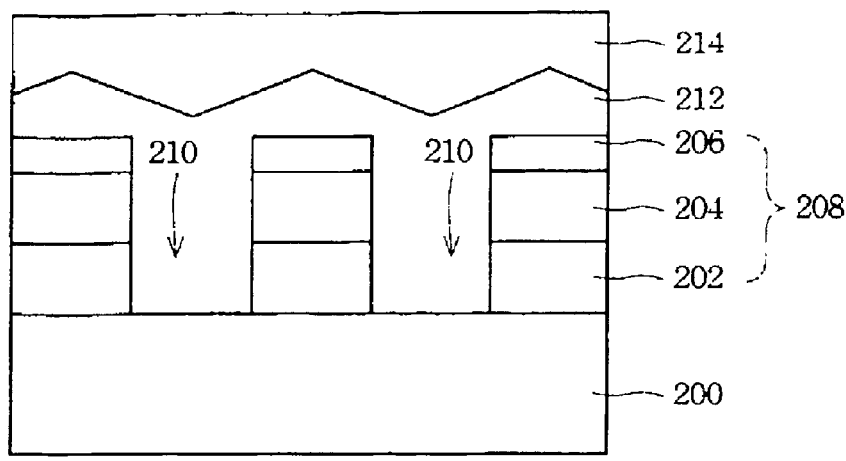
FIGS. 4–9 illustrate cross-sectional views of a process for fabricating an electrical insulating layer on bit lines of the flash memory according to the present invention.

Referring to FIG. 4, a conductive layer 202, a mask layer 204 and a cap layer 206 are sequentially formed on the gate region (not shown) of a semiconductor substrate 200. The conductive layer 202, such as a polysilicon layer, has a thickness range between 700 and 1000 angstroms. For example, the mask layer 204 is preferably a silicon nitride layer, and the cap layer 206 is a compound layer essentially comprising an oxynitride layer ($SiO_xN_y$) and a silicon-oxide layer. Thereafter, a lithography and etching process is used to form a plurality of gate stacks 208 wherein a spacing 210 is located between two gate stacks 208.

Still referring to FIG. 4, a dielectric layer 212 is formed on the semiconductor substrate 200, and then the gate stacks 208 are completely capped and the spacing 210 are filled into the dielectric layer 212. Further, the surface of the dielectric layer 212 is higher than that of the cap layer 206. Afterwards, a planarized layer 214 is formed on the dielectric layer 212 to create a planar surface. In the preferred embodiment of the present invention, the material of dielectric layer 212 is silicon-oxide formed by high-density plasma chemical vapor deposition (HDPCVD). The planarized layer 214 is a kind of organic material which is melted or dissolved in solvent, a liquid-filled solution, and is uniformly spread onto the dielectric layer 212 by surface tension of the solution.

Figure 5:
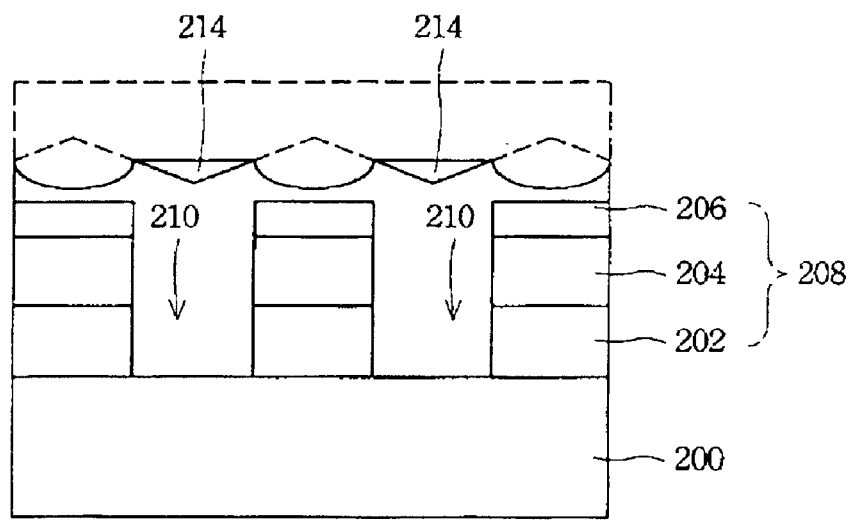

A first etching step is utilized to totally remove the planarized layer 214 with respect to the planarized layer 214 and the dielectric layer 212. The etching rate of the planarized layer 214 is less than that of the dielectric layer 212 during the first etching step. FIG. 5 is a transition cross-sectional view of the first etching step. In the preferred embodiment of the present invention, a dry etching process is performed, and the etching rate ratio between the dielectric layer 212 and the planarized layer 214 has a range from 1 to 10. The preferred etch rate ratio has a range between 3 and 10. While the planarized layer 214 is organic material and the dielectric layer 212 is silicon-oxide, a plasma etching process, using $CHF_3$, $CF_4$, $O_2$ and $N_2$ as mixed gas, will to totally remove away the planarized layer 214, and etch a portion of dielectric layer 212 during the first etching step.

Figure 6:
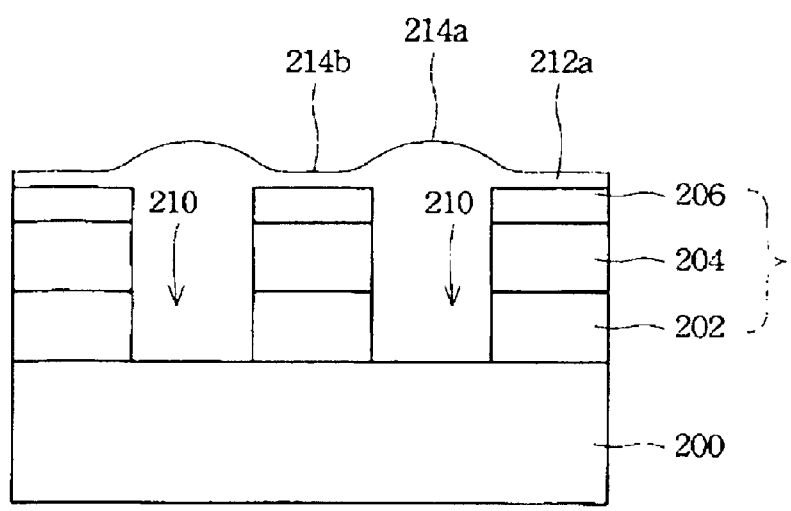

Referring to FIG. 6, after the planarized layer 214 is totally removed, a portion of dielectric layer 212a is left on the cap layer 206. In the present invention, while the planarized layer 214 is totally removed, a portion of dielectric layer 212a is still left on the cap layer 206. Also, since the etching rate of the planarized layer 214 is lower than that of the dielectric layer 212 in the first etching step, the higher surface's 214a height covered with the planarized layer 214 is larger than lower one's 214b not covered with the planarized layer 214.

Figure 7:
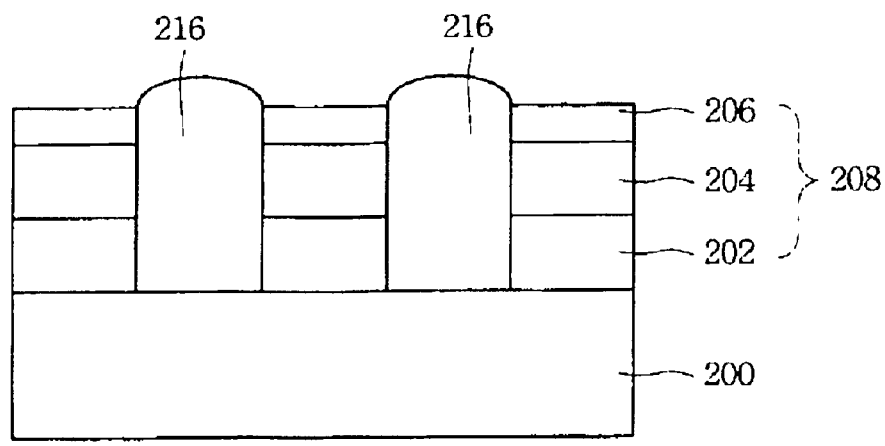

Referring to FIG. 7, a second etching step is carried out to totally remove a portion of the dielectric layer 212 over the cap layer 206 and then a spacing dielectric layer 216 remains inside the spacing 210. The etching rate of the dielectric layer is preferably higher than that of the cap layer 206 during the second etching step. In the preferred embodiment of the present invention, a dry etching process is performed, and the etching rate ratio between the dielectric layer 212 and the cap layer 206 has a range from 1 to 10. The more preferred etch rate ratio has a range between 1.1 and 4.0. The mixed gas of $CHF_3$, $CF_4$ and Ar is used to etch the dielectric layer 212 on the cap layer 206.

Figure 8:
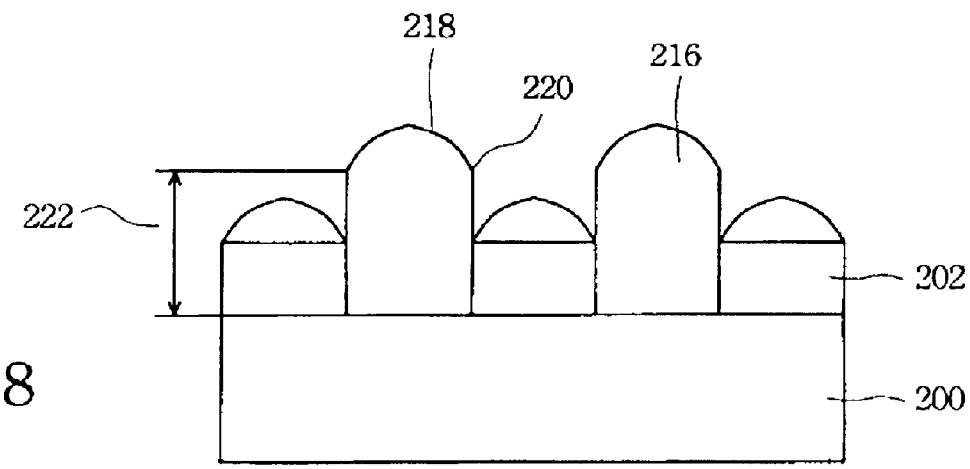

Referring to FIG. 8, a third etching step is carried out to totally remove the cap layer 206. The etching rate of the dielectric layer 212 is less than that of the mask layer 204 during the third etching step so that the spacing dielectric layer 216 has a round top 218 and slant sides 220. In the preferred embodiment of the present invention, a dry etching process is performed by using $CH_3F$, $O_2$, Ar as etching gas, and the etching rate ratio between the dielectric layer 212 and the mask layer 204 has a range from 0 and 1. The more preferred etch rate ratio has a range between 0.1 and 0.5.

The round top 218 of the spacing dielectric layer 216 is capable of preventing the later film deposition from stress concentration, and the slant sides 220 can easily avoid cracking a thin film. Furthermore, the effective thickness 222 of the spacing dielectric layer 216 is higher than that of the conventional process. In other words, the spacing dielectric layer 216 is able to sufficiently block the electron impact and retains the dopant distribution within the bit lines. The slant sides 220 of the spacing dielectric layer 216 will reduce the thickness difference between the spacing dielectric layer 216 and the conductive layer 202 to form a preferred height so that an additional over-etching is not needed for the later deposition process.

Figure 9:
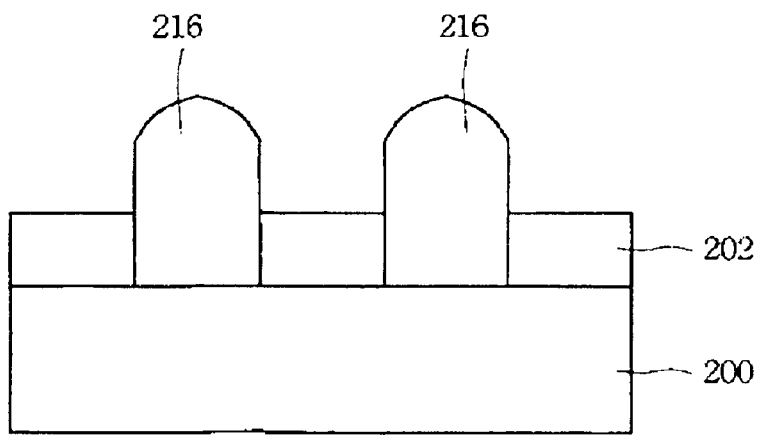

Referring to FIG. 9, the mask layer 204 is removed and thus the spacing dielectric layer 216 is left. If the mask layer 204 is the material of silicon nitride, the $H_3PO_4$ may act as an etchant to remove the silicon nitride.

According to the discussion above, the present invention provides many advantages of forming electrical insulating layer on bit lines of the flash memory. For example, during the etch back and CMP process of the planarized layer 214, the conventional recess profile of the spacing dielectric layer 216 is preferably transformed into a round top 218 and slant sides 220 to prevent a later film deposition from a cracking. Additionally, the step height between spacing dielectric layer 216 and conductive layer 202 will not become bigger with respect to the effective thickness 222, so it is not needed to increase the over-etching tolerance.

As understood by a person skilled in the art, the foregoing preferred embodiments of the present invention are illustrations rather than limitations of the present invention. They are intended to cover various modifications and similar arrangements included within the spirit and scope of the appended claims, the scope of which should be accorded the broadest interpretation so as to encompass all such modifications and similar structures.

What is claimed is:

1. A method for forming an electrical insulating layer on bit lines of the flash memory, the method comprising the steps of:

providing a semiconductor substrate having a plurality of gate stacks wherein each of said gate stacks comprises a conductive layer, a mask layer and a cap layer, and a plurality of spacing are located between said gate stacks;

forming a dielectric layer on said gate stacks to fills into said spacing wherein said dielectric layer is higher than said cap layer;

forming a planarized layer on said dielectric layer to generate a planar surface;

performing a first etching step to totally remove said dielectric layer on said cap layer and simultaneously forming a spacing dielectric layer on said spacing;

performing a second etching step to remove said cap layer wherein the etching rate of said dielectric layer is less than that of said mask layer so that said spacing dielectric layer has a round top and slant sides to prevent a thin film from stress concentration; and removing said mask layer and then remaining said spacing dielectric layer to form said electrical insulating layer.

2. The method of claim 1, wherein said conductive layer comprises a polyisilicon layer.

3. The method of claim 1, wherein said dielectric layer comprises a silicon-oxide layer.

4. The method of claim 3, wherein the step of forming said silicon-oxide layer comprises high-density plasma chemical vapor deposition (HDPCVD).

5. The method of claim 1, wherein said planarized layer comprises a kind of organic material generated by a spin-on process.

6. The method of claim 1, after the step of said forming a planarized layer is completed, further comprising a etching step for etching said planarized layer and said dielectric layer to totally remove away said planarized layer wherein the etching rate of said planarized layer is less than that of said dielectric layer.

7. The method of claim 6, wherein said etching rate ratio between said dielectric layer and said planarized layer has a range between 1 and 10 during said etching step.

8. The method of claim 1, wherein the etching rate of said dielectric layer is larger than that of said cap layer during said first etching step.

9. The method of claim 8, wherein the etching rate ratio between said dielectric layer and said cap layer has a range between 1 and 10.

10. The method of claim 1, wherein said etching rate ratio between said dielectric layer and said mask layer has a range between 0 and 1 during said second etching step.

11. A method for forming an electrical insulating layer on bit lines of the flash a method for forming an electrical insulating layer on bit lines of the flash memory, the method comprising the steps of:

sequentially forming a plurality of gate stacks on the gate region of a semiconductor substrate wherein each of said gate stacks has a conductive layer, a mask layer and a cap layer, and a plurality of spacing are located between said gate stacks;

forming a dielectric layer on the semiconductor substrate to cap said gate stacks and to fill into said spacing wherein said dielectric layer is higher than said cap layer;

forming a planarized layer on said dielectric layer to generate a planar surface;

etching said planarized layer and said dielectric layer for removing totally said planarized layer wherein the etching rate of said planarized layer is less than that of said dielectric layer and simultaneously forming a spacing dielectric layer on said spacing;

removing said cap layer wherein the etching rate of said dielectric layer is less than that of said mask layer so that said spacing dielectric layer has a round top and slant sides to prevent a thin film from stress concentration; and removing said mask layer and then remaining said spacing dielectric layer to form said electrical insulating layer.

12. The method of claim 11, wherein said conductive layer comprises a polyisilicon layer.

13. The method of claim 11, wherein said dielectric layer comprises a silicon-oxide layer.

14. The method of claim 13, wherein the step of forming said silicon-oxide layer comprises high-density plasma chemical vapor deposition (HDPCVD).

15. The method of claim 11, wherein said planarized layer comprises a kind of organic material generated by a spin-on process.

16. The method of claim 11, wherein said etching rate ratio between said dielectric layer and said planarized layer has a range from 1 to 10 in the step of etching said planarized layer and said dielectric layer.

17. The method of claim 11, further comprising a etching step remove said dielectric on said cap layer after the step of etching said planarized layer and said dielectric layer.

18. The method of claim 17, wherein the etching rate of said dielectric layer is larger than that of said cap layer.

19. The method of claim 18, wherein the etching rate ratio between said dielectric layer and said cap layer has a range between 1 and 10.

20. The method of claim 11, wherein the etching rate ratio between said dielectric layer and said mask layer has a range between 0 and 10 during the step of removing said mask layer.

* * * * *